United States Patent [19]
Swart et al.

[11] Patent Number: 6,025,951
[45] Date of Patent: Feb. 15, 2000

[54] LIGHT MODULATING MICRODEVICE AND METHOD

[75] Inventors: Nicholas R. Swart, Ancienne-Lorette; Hubert Jerominek, Sainte-Foy, both of Canada

[73] Assignee: National Optics Institute, Quebec, Canada

[21] Appl. No.: 08/753,697

[22] Filed: Nov. 27, 1996

[51] Int. Cl.[7] .................................................. G02F 1/03
[52] U.S. Cl. ........................ 359/245; 359/291; 359/224; 359/846; 359/900
[58] Field of Search .................................. 359/245, 291, 359/224, 846, 900

[56] References Cited

U.S. PATENT DOCUMENTS

| | | |
|---|---|---|
| 3,886,310 | 5/1975 | Guldberg et al. . |
| 4,317,611 | 3/1982 | Petersen . |
| 4,615,595 | 10/1986 | Hornbeck ................................ 350/360 |
| 4,662,746 | 5/1987 | Hornbeck ................................ 350/320 |
| 5,061,049 | 10/1991 | Hornbeck . |
| 5,083,857 | 1/1992 | Hornbeck . |
| 5,096,279 | 3/1992 | Hornbeck et al. . |
| 5,212,582 | 5/1993 | Nelson . |
| 5,216,537 | 6/1993 | Hornbeck . |
| 5,233,456 | 8/1993 | Nelson . |
| 5,293,511 | 3/1994 | Poradish et al. . |
| 5,312,513 | 5/1994 | Florence et al. . |
| 5,331,454 | 7/1994 | Hornbeck . |
| 5,382,961 | 1/1995 | Gale . |
| 5,392,151 | 2/1995 | Nelson . |
| 5,444,566 | 8/1995 | Gale et al. . |

*Primary Examiner*—Frank G. Font
*Assistant Examiner*—Reginald A. Ratiff
*Attorney, Agent, or Firm*—Michael D. Bednarek; Crowell & Moring LLP

[57] ABSTRACT

The invention relates to spatial light modulators (SLM) for amplitude and phase modulation of incident light. A "flexure" hinge which is provided between the SLM's substrate and micromirror comprises integral hinged sections which allow for the micromirror to tilt or to move in a piston-like fashion relative to the substrate in response to an electrostatic force. The hinge is particularly advantageous for large mirrors. In addition, the hinge can provide improved heat sinking capability over previously reported SLM hinge designs based on torsion bars and cantilever beams. The flexure hinge has sufficient mechanical flexibility that the SLM actuation voltage required is not excessively high. The flexure hinge has many applications, the preferred ones being a SLM for modulating high-energy beams and a SLM for optical channel switching.

24 Claims, 9 Drawing Sheets

LIGHT MODULATING MICRODEVICE AND METHOD

BACKGROUND OF THE INVENTION

1. Field of the Invention

The present invention relates to spatial light modulators (SLM) for amplitude and phase modulation of incident light and, more particularly, to a hinge mechanism for miniaturized spatial light modulators.

2. Description of the Prior Art

Microdevices for light modulation go back 15 years or more. In the majority of cases, these devices are comprised of an electrostatically actuated mirror, supported by torsion bars along the axis of rotation of the mirror. A classic example can be found in U.S. Pat. No. 4,317,611 issued on May 2, 1982 to Petersen, in which an "optical ray deflection apparatus" is described.

The following United States patents also belong to the prior art and the most relevant will be described hereinafter.

| U.S. Pat. No. | Issue Date | Inventor(s) |
| --- | --- | --- |
| 3,886,310 | May 27, 1975 | Guldberg et al. |
| 4,615,595 | Oct. 7, 1986 | Hornbeck |
| 5,061,049 | Oct. 29, 1991 | Hornbeck |
| 5,096,279 | Mar. 17, 1992 | Hornbeck and Nelson |
| 5,083,857 | Jan. 28, 1992 | Hornbeck |
| 5,331,454 | Jul. 19, 1994 | Hornbeck |
| 5,382,961 | Jan. 17, 1995 | Gale |
| 5,444,566 | Aug. 22, 1995 | Gale et. al. |
| 5,233,456 | Aug. 3, 1993 | Nelson |
| 5,212,582 | May 18, 1993 | Nelson |
| 5,392,151 | Feb. 21, 1995 | Nelson |
| 5,216,537 | Jun. 1, 1993 | Hornbeck |
| 5,293,511 | Mar. 8, 1994 | Poradish and McKinley |
| 5,312,513 | May 17, 1994 | Florence and Boysel |

SUMMARY OF THE INVENTION

It is therefore an aim of the present invention to provide a novel hinge mechanism for micro mirror-based spatial light modulators used for at least one of amplitude and phase modulations of incident light.

It is also an aim of the present invention to provide a "flexure" hinge mechanism for miniaturized micro mirror-based spatial light modulators.

It is a further aim of the present invention to provide a "flexure" hinge mechanism for miniaturized micro mirror-based spatial light modulators having improved heat sinking capability.

It is a still further aim of the present invention to provide a flexure hinge mechanism for miniaturized spatial light modulators which is particularly well suited for supporting relatively large (>50 μm) micromirrors prone to sagging in the middle if their support is provided only at their edges, such as by conventional torsion hinges.

Therefore, in accordance with the present invention, there is provided a hinge for supporting a mirror in a light modulator, comprising at least one arm means adapted to be provided at an upper end thereof with mirror, said arm means being adapted to extend substantially under the mirror means and being displaceable between deformed and extended positions thereby allowing for the displacement of the mirror means.

Also in accordance with the present invention, there is provided a mirror for light modulators, comprising light receiving means, hinge means being adapted to be provided at an upper end thereof with said light receiving means, said hinge means being adapted to extend substantially under said light receiving means and being displaceable between deformed and extended positions thereby allowing for the displacement of said light receiving means.

Further in accordance with the present invention, there is provided a light modulator comprising mirror means, substrate means provided with electrode means, and hinge means extending between said substrate means and said mirror means and substantially thereunder, said hinge means being displaceable for allowing for the displacement of said mirror means.

Still further in accordance with the present invention, there is provided a method for producing a light modulator, comprising the steps of:

(a) providing base means containing control circuit means for the light modulator and providing electrode means on said base means;

(b) providing a sacrificial layer means on said base means and electrode means;

(c) patterning said sacrificial layer means, at least part of a shape of which is complementary to a hinge of said light modulator and downwardly extends to said base means;

(d) providing first metal layer means on said sacrificial layer means and said base means for constituting said hinge;

(e) providing second metal layer means on said first metal layer means for constituting a mirror of said light modulator; and (f) removing said sacrificial layer means.

Still further in accordance with the present invention, there is provided a method for producing a light modulator, comprising the steps of:

(a) providing base means containing control circuit means for the light modulator and providing electrode means on said base means;

(b) providing first sacrificial layer means on said base means and electrode means;

(c) patterning said first sacrificial layer means, at least part of a shape of which is complementary to a hinge of said light modulator and downwardly extends to said base means;

(d) providing first metal layer means on said first sacrificial layer means and said base means for constituting said hinge;

(e) providing second sacrificial layer means on part of said first metal layer means;

(g) providing second metal layer means on said first metal layer means and on said second sacrificial layer means for constituting a mirror of said light modulator;

(h) shaping said second metal layer means and said first metal layer means for respectively constituting a mirror and a hinge of said light modulator; and (i) removing said first and second sacrificial layer means.

Still further in accordance with the present invention, there is provided a method for producing a light modulator, comprising the steps of:

(a) providing base means containing control circuit means for the light modulator and providing electrode means on said base means;

(b) providing first sacrificial layer means on said base means and electrode means, said first sacrificial layer means having at least part of a shape thereof complementary to a lower part of a hinge of said light modulator and downwardly extending to said base means;

(c) providing first metal layer means on said first sacrificial layer means and said base means for constituting the lower part of said hinge;

(d) providing second sacrificial layer means on part of said first metal layer means;

(e) providing second metal layer means on said first metal layer means and on said second sacrificial layer means for constituting an upper part of said hinge;

(f) providing third sacrificial layer means on said second metal layer means and on said first sacrificial layer means;

(g) providing third metal layer means on said second metal layer means and on said third sacrificial layer means for constituting a mirror of said light modulator; and (h) removing said first, second and third sacrificial layer means.

BRIEF DESCRIPTION OF THE DRAWINGS

Having thus generally described the nature of the invention, reference will now be made to the accompanying drawings, showing by way of illustration a preferred embodiment thereof, and in which:

FIG. 4 is a perspective view of the flexure hinge of FIG. 2a;

FIGS. 8(1) to 8(8) schematically illustrate in eight vertical cross sectional views, in sequence, the steps for producing the first flexure hinge of FIG. 2a in accordance with a first method of the present invention;

FIGS. 9(1) to 9(10) schematically illustrate in ten vitical cross sectional views, in sequence, the steps for producing the first flexure hinge of FIG. 2a in, accordance with a second method of the present invention; and FIGS. 10(1) to 10(10) schematically illustrate in ten vertical cross sectional views, in sequence, the steps for producing the second flexure hinge of FIG. 5 in accordance with a third method of the present invention.

DESCRIPTION OF THE PREFERRED EMBODIMENTS

As discussed previously, microdevices for light modulation go back 15 years or more. In the majority of cases, these devices are comprised of an electrostatically actuated mirror, supported by torsion bars along the axis of rotation, as in aforementioned U.S. Pat. No. 4,317,611 to Petersen describing an "optical ray deflection apparatus".

Before proceeding with a detailed description of the present invention, and the motivations behind and supporting its design, it is worthwhile to briefly discuss the basic fundamentals of electrostatic light modulating devices, including an overview of SLM devices and a discussion of the pertinent prior art.

Figure 1A:
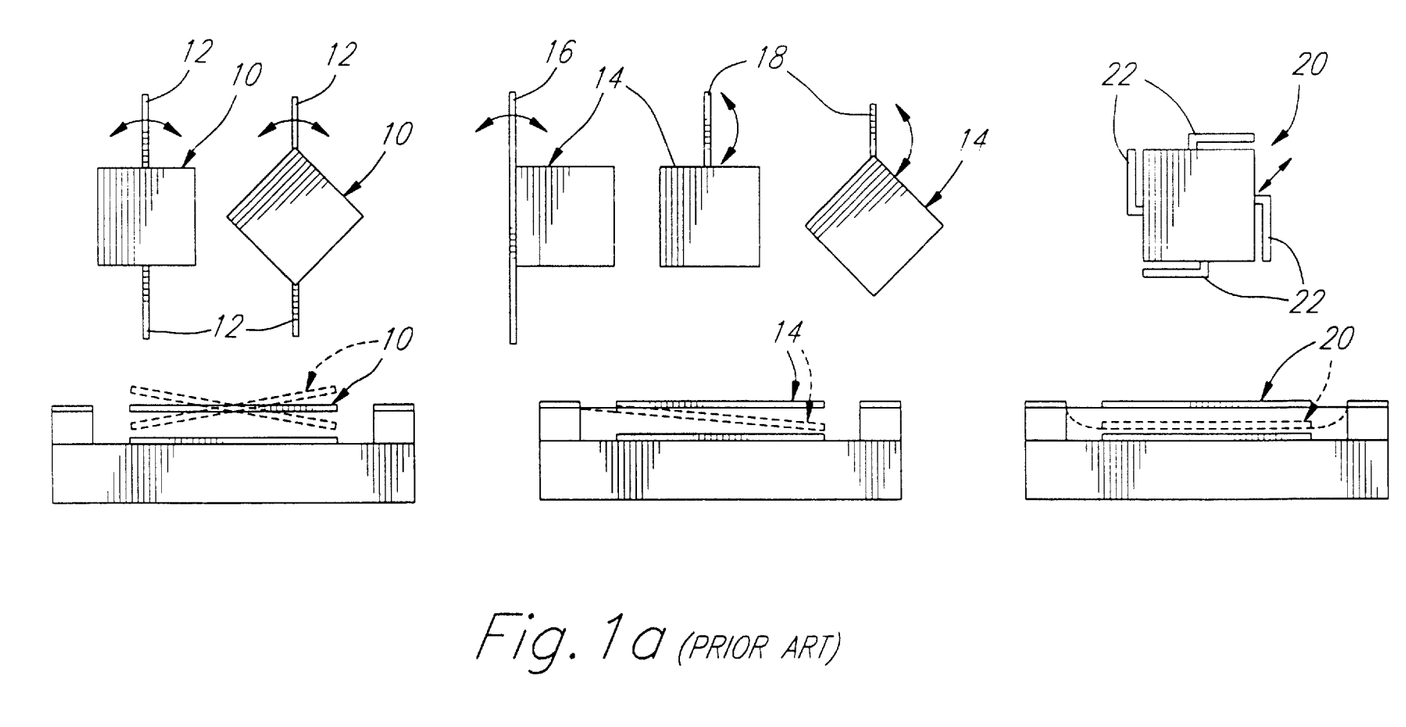
FIG. 1a schematically illustrates three conventional and fundamental SLM architectures and their associated modulation properties.

In FIG. 1a, schematics of the three fundamental SLM architectures and associated modulation properties are shown. To the left, a torsion mirror 10 which provides amplitude modulation is suspended by torsion hinges 12 along an axis of symmetry, e.g. an axis that extends through the middle of opposed edges of a square mirror, an axis that extends through opposed corners again of a square mirror, etc. The torsion mirror 10 can be used to steer light into, or away from, the acceptance cone of an optical imaging system. Amplitude modulation is obtained by controlling the length of time the light is directed into the acceptance cone during one image frame. The technique is referred to as pulse-width modulation. This type of SLM is typically operated in a digital mode.

In the middle of FIG. 1a, a cantilever type SLM 14 is supported by either a torsion hinge 16 or a flap-based hinge 18. This type of SLM provides both amplitude and phase modulation, and is typically operated in an analog mode.

A piston type SLM 20, shown on the right of FIG. 1a, provides strictly phase modulation of the incident light. The piston type SLM 20 is usually supported by four flap hinges 22 and the mirror moves in a direction perpendicular to its plane. This device is usually operated in analog mode.

Of the three prior art SLM designs described hereinabove, the torsion based device is the most common, in part due to its popularization by Texas Instruments. The prior art discussion which follows will therefore focus primarily on this device. Nevertheless, the underlying principles, can for the most part, be applied to the other SLM designs.

Figure 1B:
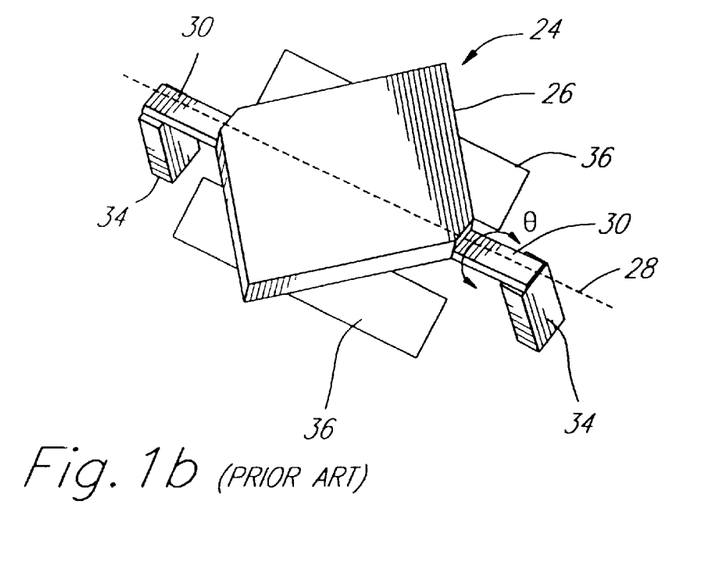
FIG. 1b is a schematic perspective view of a conventional electrostatically actuated micromirror equipped with torsion hinges.
Figure 1C:
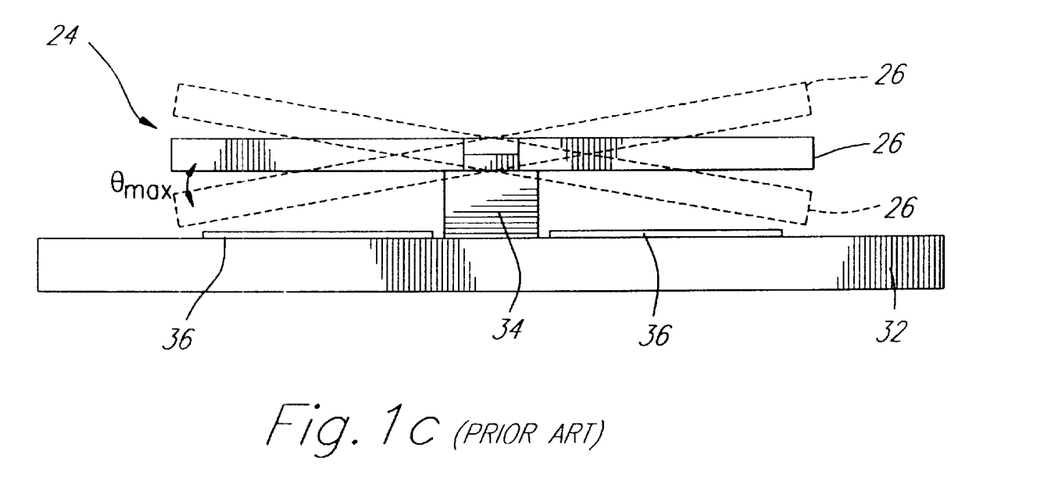
FIG. 1c is an end elevational view of the micromirror of FIG. 1b which also shows various positions of the mirror.

In FIGS. 1b and 1c, generic schematics of an electrostatically actuated torsion hinge device 24 are shown. FIG. 1b illustrates the basic architecture, while FIG. 1c represents a schematic vertical cross section of the device 24. In FIG. 1b, it is shown that the device architecture includes a mirror 26 suspended along an axis of rotation 28 by torsion bar hinges 30 (as discussed earlier), the axis of rotation in this particular device 24 extending symmetrically through opposed corners of the mirror 26. The torsion bars 30 are in turn suspended above an underlying substrate 32 by support posts 34. Also on the substrate 32, some distance from the axis of rotation 28, are drive electrodes 36.

The mirror 26 and drive electrodes 36 are electrically conductive, and form a parallel plate capacitor.

Applying a potential difference between the mirror 26 and one of the drive electrodes 36 loads charge onto the capacitor plates, the quantity of charge being a function of the effective capacitance and the potential difference. Because the charge on the mirror 26 and given electrode 36 are of opposite sign, an electrostatic attractive force is generated which pulls the mirror 26 towards the charged electrode 36. This, in turn, causes the mirror 26 to tilt an angle θ about its axis of rotation 28. The maximum angle of tilt, $\theta=\theta_{max}$, occurs when the mirror 26 touches the underlying substrate 32, and is governed by the maximum length of extension of the mirror 26 from its axis of rotation 28, and the height of the support posts 34. Typical values for $\theta_{max}$ range from a fraction of a degree to as much as 10°. It is common practice to define a normalized tilt angle α, viz. $\alpha=\theta/\theta_{max}$.

A number of modes of operation for such a torsion hinge device 24 are possible, and they include bistable, tristable, and analog. In bistable mode (binary mode), the mirror 26 is operated in only two states, namely α±1. Here, a sufficiently high potential is applied to a given address electrode 36 so that the mirror 26 turns until it rests on the underlying substrate 32. This is a useful mode of operation when the application requires binary amplitude modulation of an incident light beam. In the second mode of operation, the mirror 26 has three states, α=0°, α±1. While this mode of operation is in principle possible, it is not often used because the α=0° position is usually imprecise; because of mechanical and material considerations, it is not guaranteed that the torsion hinges 30 will restore the mirror 26 to precisely the α=0° position. In the third mode of operation, a variable voltage is applied to the address electrodes 36, causing the mirror 26 to tilt in an analog fashion. The theory behind these three operational modes is rather involved, and is elaborated in more detail in several of the patents cited herein.

Cantilever and piston type devices are generally operated only in analog mode. The operation is similar to that described above for analog operation of the torsion type device 24. Note that in the cantilever and piston type devices there is typically only one address electrode.

Certain requirements must be met in order for a SLM device to be useful. For one, the torque required to twist the torsion bars (restoring torque) must not exceed the torque that can be generated electrostatically using a "reasonable" potential difference. The acceptable maximum potential difference is typically governed by the type of control circuitry used, although other factors can prevail as well.

The mirror must be rigid enough that it does not bend significantly when actuated. Bending occurs because the force which causes the mirror to move is not matched by an equal an opposite force on the other side of the axis of rotation. The acceptable level of bending is dictated primarily by the light wavelength(s) for which the device is intended to operate, and the optical configuration in which it is incorporated.

The mirror must be spaced sufficiently high enough above the underlying substrate so that an adequate angle of tilt is provided for the given application. Since large vertical distances are difficult to obtain using thin film processing technologies, tilt angles are generally limited to small values. Assuming a flat mirror and substrate, then $\theta_{max}=\text{Tan}^{-1}$ (h/l) where h is the height of the supports, and l is the length of extent of the mirror taken perpendicular to the axis of rotation.

Finally, a high fill factor is important, particularly when SLM's are arranged in arrays. Therefore, the area required for the support mechanism must be small relative to the mirror area. Because of processing considerations, high fill factors become more difficult to obtain as mirror size is reduced.

Similar requirements exist for the cantilever and piston type devices.

Now addressing the relevant prior art in SLM's, or more precisely, μ(micro)-SLM's.

One of the first examples of such a device is found in the patent to Guldberg and Nathanson, U.S. Pat. No. 3,886,310 which was issued in 1975. A brief discussion of the invention thereof is worthwhile as it illustrates some of the underlying concepts of μ-SLM's. The device is used to project images by diffraction, using a complex optical system, which includes the usual Schlieran stop (or equivalent) found in most diffraction based projection systems. Electrostatic actuation is achieved by charging the planar reflective portion of the structure with an electron beam (the mirror array is mounted inside an electron picture tube). This device is intended primarily for projection in the visible part of the spectrum. The hinge mechanism is a type of flap connected to one corner of the mirror, which bends when the mirror is tilted. The mirrors are arranged in a cloverleaf fashion, with four hinged mirrors (wings) supported by a central post.

In 1982, Petersen's aforementioned U.S. Pat. No. 4,317,611 was issued which describes an "optical ray deflection apparatus". This device represents a key milestone in the development of miniaturized SLM's. It is constructed in a hybrid fashion, with the lower portion containing the address electrodes, and the upper portion containing the mirror. These two portions are glued together. It is noted that this construction makes mass production of the device rather difficult.

Electrostatic actuation is achieved by applying a positive bias to one of the address electrodes with respect to the mirror, causing the mirror to tilt about it. It is worth noting that Petersen states that the actuation voltage is in the order of 300 volts, significantly higher than what can be obtained with standard IC semiconductor circuitry. The supporting "land" prevents the mirror from collapsing on the substrate when actuated due to the long torsion hinges. The intended application for this device is primarily in optical scanning systems, in which the mirror is operated at, or near, a mechanical resonance.

Subsequent to the Petersen's Patent, an extensive collection of prior art developments were made in the art of SLM's by Texas Instruments (TI) Inc., a recognized leader in the μ-SLM field. Texas Instruments has made extensive developments over 15 years to their μ-SLM technology. Note that TI uses the acronym DMD when referring to their technology, which originally stood for "Deformable Micromirror Device". TI has since changed the meaning of the acronym to "Digital Micromirror Device".

Texas Instruments have geared their DMD technology towards two key applications: high-resolution projection displays, and high-resolution colour printing systems. The requirements associated with these applications have therefore had a significant influence on TI's DMD architecture. The mirrors are small (16 μm by 16 μm) and tightly spaced (17 μm pitch), so that large density arrays can be fabricated in a manageable area of silicon. For example, a 1000 by 1000 pixel array occupies only 2.9 cm² of silicon. The mirrors also switch very quickly (≈5 μs), a necessary requirement because a pulse width modulation scheme is used to achieve grey scale imaging; the faster the mirror switching time, the larger the number of intensity levels that can be produced. The DMD arrays are manufactured on top of a standard 5V CMOS circuitry and therefore have low switching voltages. The 5V CMOS technology is mandated by the extremely high mirror density requirements.

The first TI patent in this area, U.S. Pat. No. 4,615,595, is entitled "Frame Addressed Spatial Light Modulator" and issued in 1986. This Patent describes a cloverleaf mirror design, fabricated on a CCD CMOS circuit.

The underlying CCD is used to pump electrical charge onto the cloverleaf, causing all four mirrors to deflect downward to the ground plane. While the method of charging the mirror is novel, this device is very similar in concept to that described in U.S. Pat. No. 3,886,310 mentioned previously. In particular, the cloverleaf and hinge mechanism is for all intents and purposes the same as that described by Guldberg and Nathanson.

The architecture and control circuit approach disclosed in U.S. Pat. No. 4,615,595 has since been replaced by another design which will be addressed hereinafter. One reason was undoubtedly due to the poor contrast of projection systems employing the device, since its operation requires a Schlieran configuration (or equivalent). In 1991, U.S. Pat. No. 5,061,049 was awarded to Hornbeck. In this patent, the mirror is supported by torsion hinges which twist when the mirror rotates. In this regard, the design is similar to that of Petersen, although here the manufacturing process is monolithic. Also, this mirror design does not require a Schlieran projector for imaging, and can therefore be used to produce high-brightness, high-contrast images.

The torsion hinges must clearly be made thinner than the mirror in order for the device to rotate without warping. The hinges are supported above the substrate by a spacer layer (or equivalent, such as metal support posts). Electrostatic actuation is achieved using the addressing electrodes. In order that the mirror can be turned with small voltages, these hinges must be extremely thin, ~700 angstroms, and fairly long, i.e. more than 8 μm. While the torsion hinge design is suitable for small mirrors, it does not work well for large mirrors; larger structures will tend to sag in the middle if support is provided only at their edges. In addition, because the hinges must be thin, and long, they generally exhibit a low thermal conductance. This reduces the mirrors capability to adequately dissipate heat, which can result in irreversible damage should it be employed for modulation of high energy beams.

Using the fabrication process described in this same Patent, a variety of hinge configurations are possible. For example, the mirror can be hinged at one corner, or along one edge. It must be noted that when the mirror is hinged at a corner, the hinge is of the bending type, rather than the torsion type.

U.S. Pat. No. 5,083,857 issued to Hornbeck in 1992 describes a novel two level mirror structure in which the torsion hinges are placed in a layer beneath the mirror layer. This two layer structure, was required to improve of the low fill factor of TI's first generation mirror design. As was mentioned earlier, torsion hinges need to be fairly long for sufficient flexibility thereby limiting the packing density of mirrors supported by such hinges. For the small mirrors, the fill factor is inadequate using a one-level architecture. By placing the hinge mechanism directly beneath the mirror, and connecting this mechanism to the mirror by a yoke, the fill factor is improved significantly.

The actuation mechanisms described in the earlier TI Patents still apply to this hidden hinge architecture and a number of hinge configurations are possible. One key drawback of this architecture is the complex fabrication process required and this manufacturing process is set forth in the Patent. Despite this drawback, the small mirror size and high fill factors required for high-resolution projection displays has forced TI to employ this method of fabrication in their commercial DMD arrays.

U.S. Pat. No. 5,233,456 issued to Nelson discloses a method to extend the basic DMD architecture to larger mirror sizes. According to this patent, a larger mirror can be supported by a plurality of torsion hinges included along the axis of rotation. These torsion hinges, and the method of fabrication, are identical to the standard DMD design. The Patent covers a resonant mirror fabricated using this approach.

U.S. Pat. No. 5,212,582, also issued to Nelson, is virtually identical in content to U.S. Pat. No. 5,233,456, except that it describes how the hidden hinge architecture can be used for fabricating large mirrors.

Finally, U.S. Pat. No. 5,312,513 issued to Florence et al. discloses a method of forming phase light modulators using the basic DMD hidden hinge architecture. These phase light modulators are of the piston type. A particularly unique feature of this invention is that the phase modulation is achieved using binary addressing circuitry, i.e. the pistons are operated in digital mode. Phase modulation is achieved by resolving light from two or more sub-elements, each designed to have different zero-offset phase differences.

The above summarizes the key points concerning the prior art.

Figure 2A:
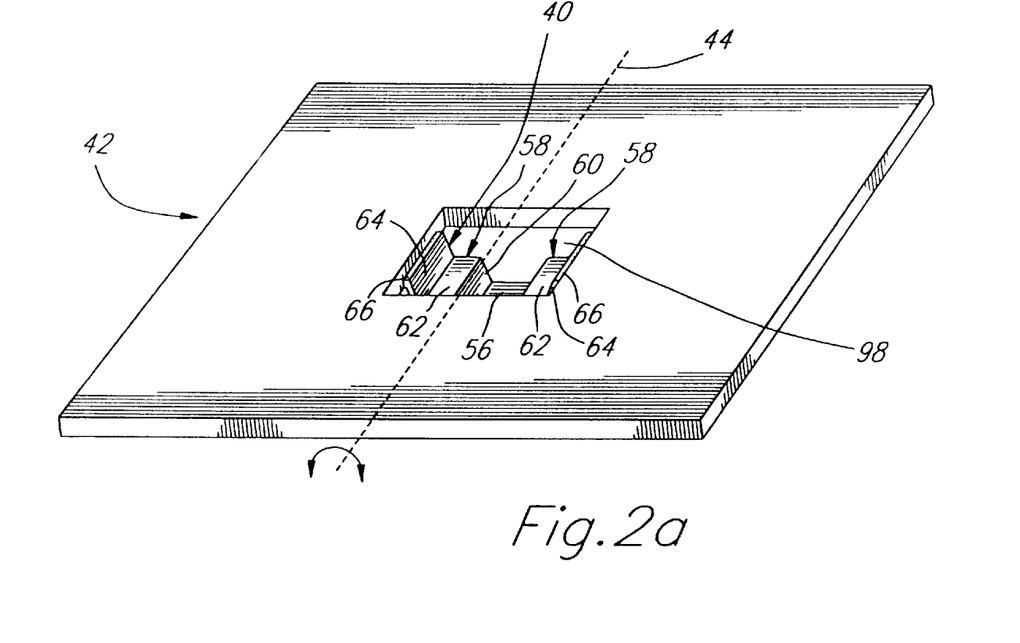
FIG. 2a is schematic perspective view of a micro-SLM having an integrated flexure hinge in accordance with a first embodiment of the present invention.
Figure 2B:
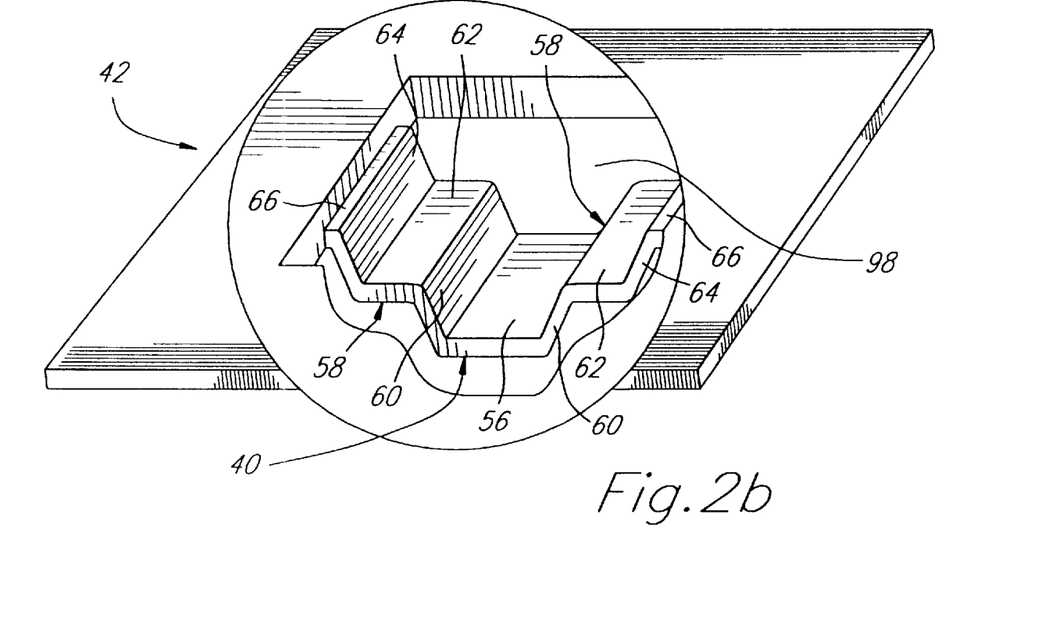
FIG. 2b is a perspective view similar to FIG. 2a but wherein the hinge is shown enlarged.

In accordance with the present invention, FIGS. 2a, 2b, 3a, 3b and 3c illustrate a micro-SLM M having an integrated flexure hinge 40 in accordance with a first embodiment of the present invention with FIG. 2b showing the hinge 40 in an enlarged state. Basically, the present invention proposes this new hinge mechanism or hinge 40 for μ-SLM's.

The hinge 40 is integrated with a mirror 42 and will be referred to as the flexure hinge 40 based on its behavioral properties and characteristics, i.e. in view of how it operates. In the drawings, there is shown only one such flexure hinge 40 for supporting the mirror 42. However, it is readily understood that a plurality of flexure hinges 40 can be used to support a single mirror, particularly if the mirror is large. The flexure hinge 40 is electrically conductive so that the mirror 42 can be electrostatically actuated. The flexure hinge 40 does not have a fixed axis of rotation, as in the case of torsion hinges, for example. Nevertheless, the axis of rotation moves only slightly when the mirror 42 is actuated. An approximate position of the axis of rotation 44 of the mirror 42 is shown in FIG. 2a for illustration purposes.

Figure 3A:
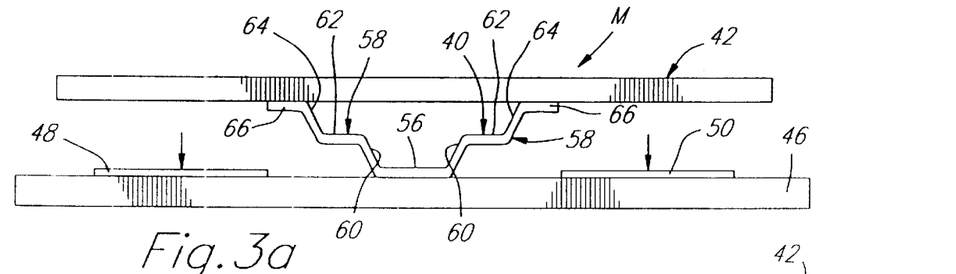
FIG. 3a is a schematic elevational view of the micro-SLM of FIG. 2a. shown in an unbiased state.
Figure 3B:
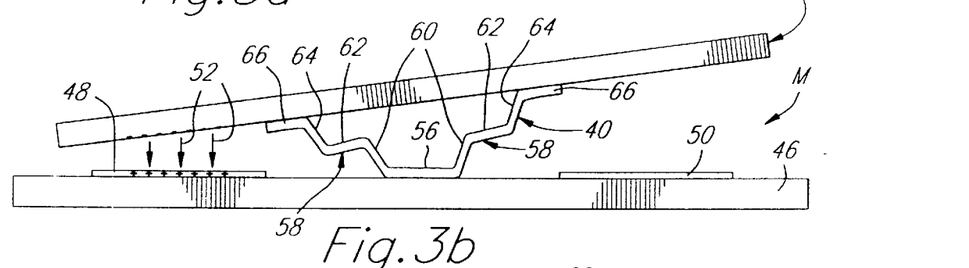
FIG. 3b is a schematic elevational view similar to FIG. 3a but showing the mirror being operated in amplit modulation mode.
Figure 3C:
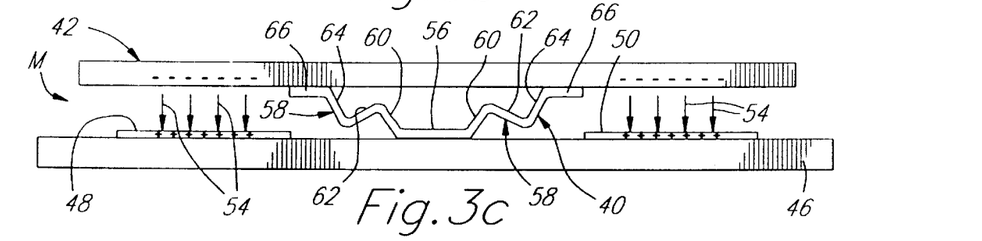
FIG. 3 is a schematic elevational view similar to FIG. 3a but showing the mirror being operated in phase modulation mode.

In FIGS. 3a, 3b and 3c, various two-dimensional vertical cross sections of the SLM M with its electrostatically actuated mirror 42 incorporating the flexure hinge 40 are shown. More particularly, FIG. 3a shows the mirror 42 in an unbiased state, with FIG. 3b showing the mirror 42 being operated in amplitude modulation mode, whereas FIG. 3c shows the mirror being operated in phase modulation mode. The flexure hinge 40 is located on top of a substrate 46 and two address electrodes 48 and 50 are deposited on the substrate 46.

With reference to FIG. 3b, when a potential is applied between the mirror 42 and one of the address electrodes 48 and 50, in this case the electrode 48 as seen in FIG. 3b, an electrostatic force 52 causes the mirror 42 to tilt. This represents the amplitude mode of operation. A sufficiently high potential will cause the mirror 42 to tilt until it touches the substrate 46. Releasing the potential causes the mirror 42 to return to approximately the horizontal position due to restoring torque of the hinge 40.

Now referring to FIG. 3c, if equal potentials are simultaneously applied to both electrodes 48 and 50 with respect to the mirror 42, an electrostatic force 54 causes the mirror 42 to be pulled down towards the substrate 46 while substantially remaining in a horizontal position. This is the phase modulation mode of operation.

Figure 4:
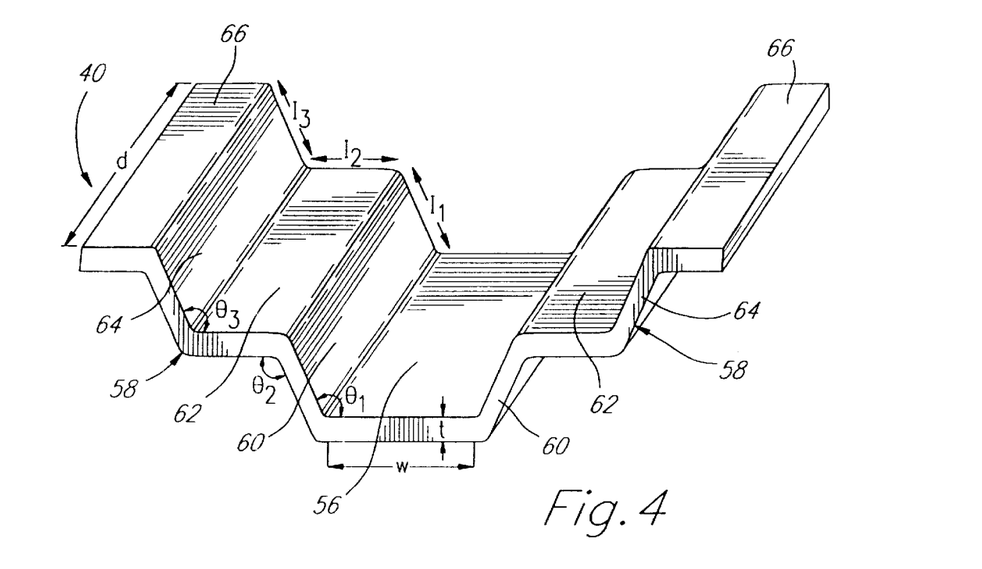

With reference to FIG. 4, the flexure hinge 40 comprises a lower horizontal web 56 sitting atop the substrate 46 and a pair of integral side arms 58 of composite configuration which extend upwardly and symmetrically from opposite edges of the web 56. Each side arm 58 includes a lower angled section 60, an intermediate substantially horizontal section 62, an upper angled section 64, and a mirror supporting flange 80 at the upper end of the angled section 64.

The key geometrical parameters which characterize the flexure hinge 40 are shown in FIG. 4 and include the thickness t of the material forming the flexure hinge 40, the length w of the web 56, the respective lengths 11, 12 and 13 of the lower angled section 60, of the horizontal section 62 and of the upper angled section 64, respectively, and a hinge width d. Furthermore, the web 56 and the lower angled section 60 define therebetween an angle $\theta_1$, with the lower angled section 60 and the horizontal section 62 defining therebetween an angle $\theta_2$, whereas the horizontal section 62 and the upper angled section 64 define therebetween an angle $\theta_3$. The restoring torque of the flexure hinge 40 is a complex function of all of these parameters. Moreover, it also depends on the mechanical properties of the hinge construction material. It must be noted that the flexure hinge 40 material does not necessarily have to be of the same thickness, or of the same type, as that of the mirror 42.

The flexure hinge 40 can be designed so that it is rigid enough to support the weight of a mirror without sagging, while at the same time being flexible enough that actuation voltages are manageable. It is reminded that a mirror, such as the mirror 42, supported with this type of flexure hinge 40 can be operated in either phase or amplitude modulation mode.

Figure 5:
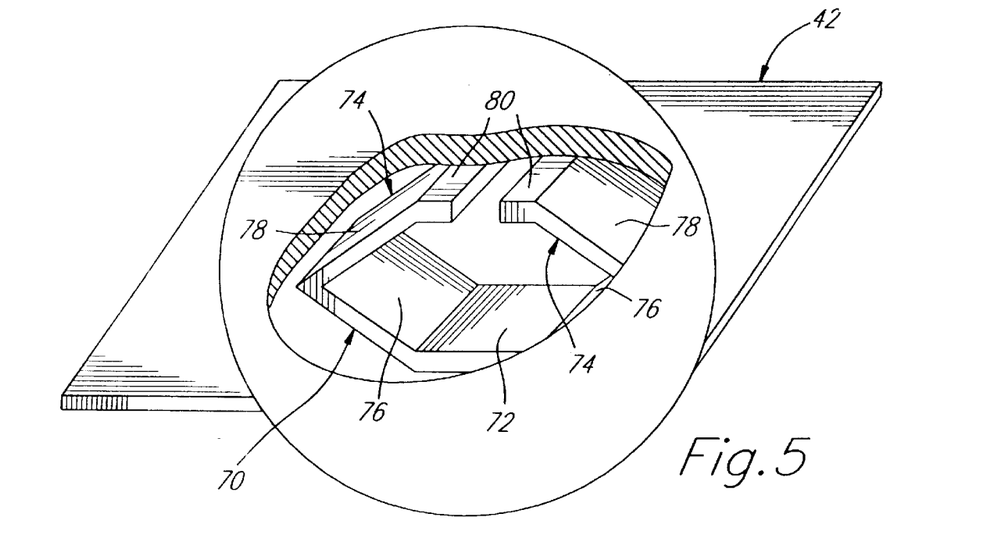
FIG. 5 is shematic perspective view of a micro-SLM having an integrated flexure hinge in accordance with a second embodiment of the present invention and wherein the hinge is shown enlarged.
Figure 6A:
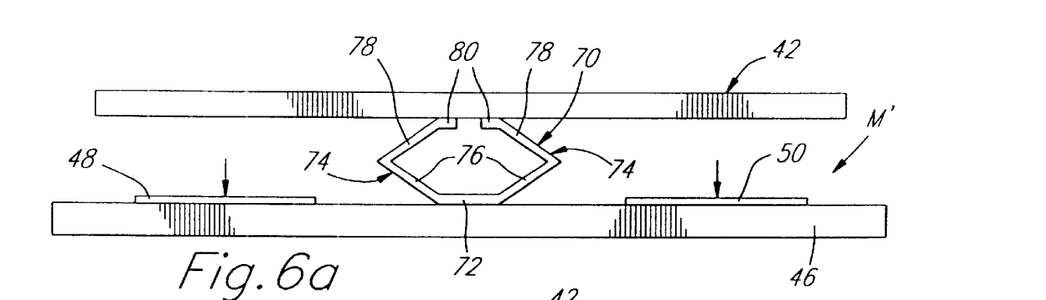
FIG. 6a is a schematic elevational view of the micro-SLM of FIG. 5 shown in an unbiased state.
Figure 6B:
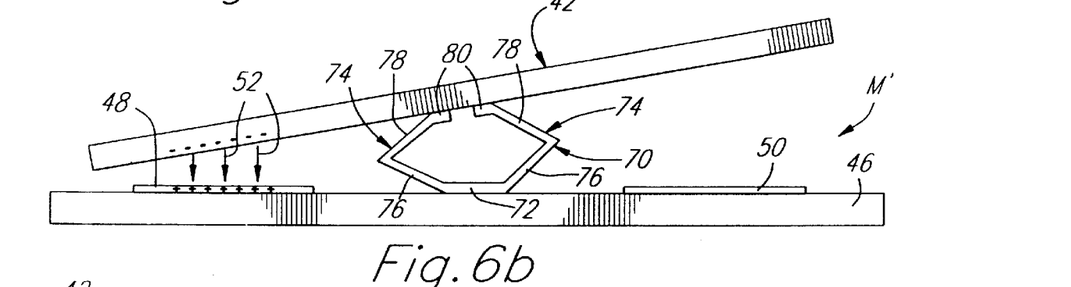
FIG. 6b is a schematic elevational view similar to FIG. 6a but showing the mirror being operated in amplitude modulation mode.
Figure 6C:
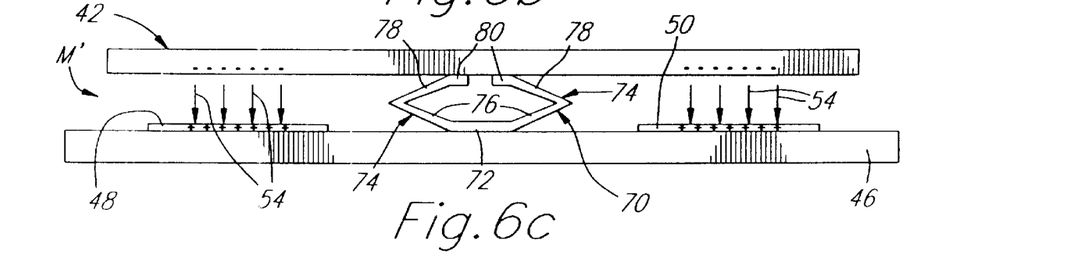
FIG. 6c is a schematic elevational view similar to FIG. 6a but showing the mirror being operated in phase adulation mode.
Figure 7:
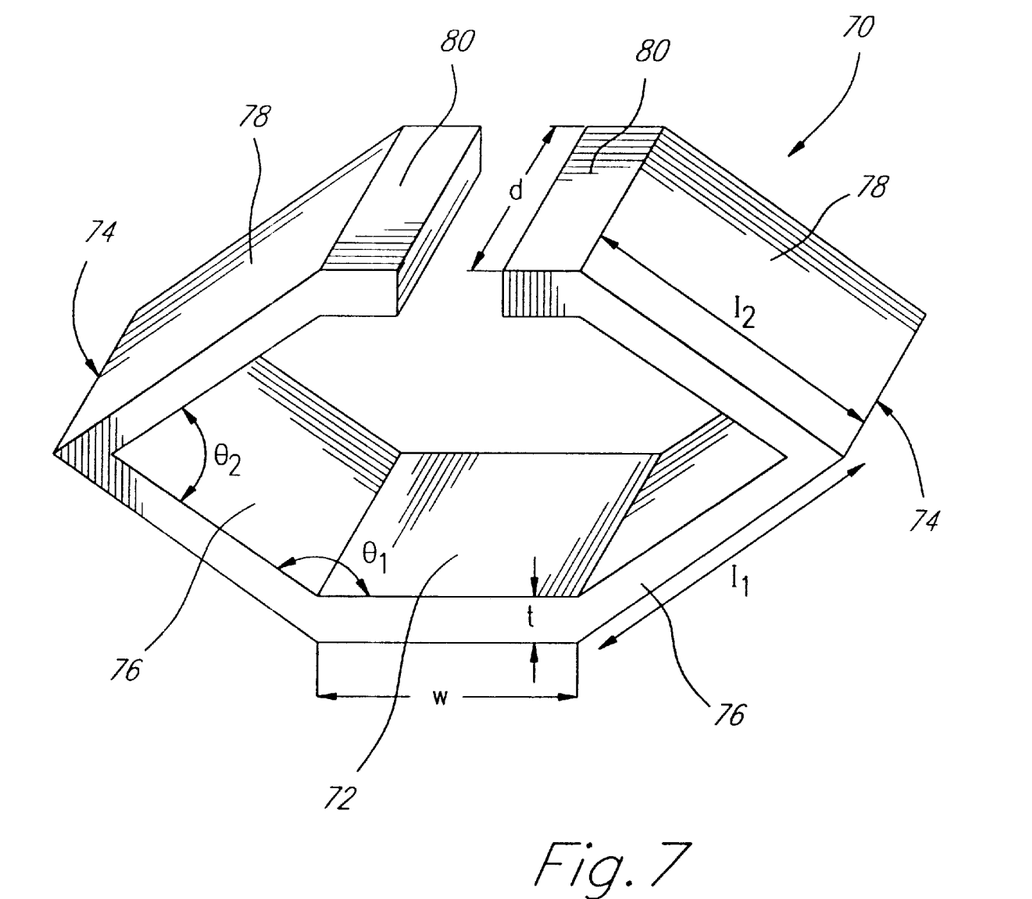
FIG. 7 is a perspective view of the flexure hinge of the FIG. 5.
Figure 8:
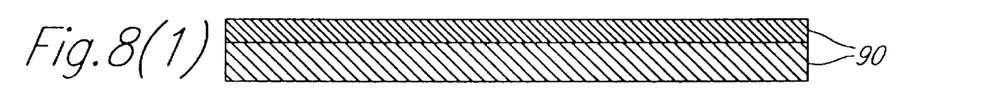
Figure 9:
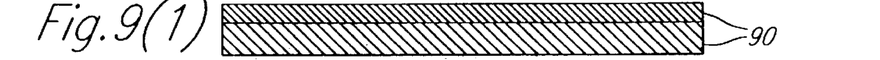
Figure 10:
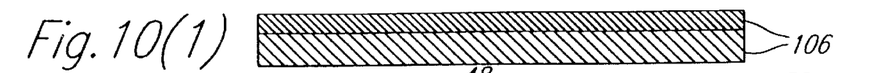

Now referring to FIGS. 5 to 7, there is shown a second flexure hinge 70 also in accordance with the present invention which is similar to the first flexure hinge 40 in how it behaves (see FIGS. 6b and 6c showing the hinge 70 subjected to electrostatic forces in amplitude modulation mode and in phase modulation mode, respectively). As with the first flexure hinge 40, the second flexure hinge 70 is electrically conductive so that the supported mirror 42 can be electrostatically actuated. The mirror 42 and its hinge 70 are on the substrate 46 and form a second SLM M'. Operation of a mirror supported by this hinge 70 is that same as that in the first hinge 40, as illustrated in FIGS. 6a, 6b and 6c. As before, the mirror 42 can be operated in either amplitude or phase modulation mode.

The key geometrical parameters characterizing the hinge 70 are shown in FIG. 7. As for the first hinge 40, the flexure hinge 70 of FIG. 7 comprises a lower horizontal web 72 sitting atop the substrate 46 and a pair of integral side arms 74 of composite configuration which extend upwardly and symmetrically from opposite edges of the web 72. Each side arm 74 includes a lower angled section 76, an upper angled section 78 and a mirror supporting flange 80 at the upper end of the upper angled section 78.

The key geometrical parameters which characterize the flexure hinge 70 are shown in FIG. 7 and include the thickness t of the material forming the flexure hinge 70, the length w of the web 72, the respective lengths 11 and 12 of the lower angled section 76 and of the upper angled section 78, respectively, and a hinge width d. Furthermore, the web 72 and the lower angled section 76 define therebetween an angle $\theta_1$, whereas the lower angled section 76 and the upper angled section 78 define therebetween an angle $\theta_2$. The restoring torque of the flexure hinge 70 is a complex function of all of these parameters. It also depends on mechanical properties of the hinge construction material.

It is easily understood that both flexure hinges 40 and 70 include a pair of symmetrical composite side arms which are adapted to fold under the mirror 42 either symmetrically and identically under phase modulation mode (where the mirror 42 is drawn translationally towards the substrate 46 while remaining substantially horizontal), or individually under amplitude modulation mode (where one side arm is retracted or folded while the other is deployed).

FIGS. 8(1) to 8(8) and 9(1) to 9(10) illustrate two possible procedures or processes for manufacturing a mirror incorporating the flexure hinge 40 of FIGS. 2a and 2b to 4. The process flows are highly generic, and are by no means optimal. They serve merely to illustrate the essential fabrication steps required.

The steps of the first process are shown in FIGS. 8(1) to 8(8) and are respectively as follows:

Step 1 The starting material is a passivated and planarized silicon wafer 90 equipped with a control circuit for the micromirror device or array of such devices. This circuit is fabricated using standard IC processing;

Step 2 The micromirror address electrodes 48 and 50 with a typical thickness not exceeding 0.5 $\mu$m are fabricated using a combination of physical vapor deposition (PVD) and lift-off techniques. Alternatively a wet or dry metal etch can be used in place of using a lift-off technique;

Step 3 A sacrificial layer of polyimide 92 (typical thickness less than 10 $\mu$m) or any other material compatible with the device processing is deposited. The thickness of this layer 92 defines a separation between the mirror 42 and the silicon substrate 90, and therefore defines the maximum angle of tilt. It also serves to define the height of the flexure hinge 40;

Step 4 A first patterning of the sacrificial layer 92 is performed into 92' using a combination of standard photolithography and a reactive ion etching (RIE) process in an $O_2$ atmosphere. This defines the horizontal sections 62 and the upper angled arm sections 64 of the flexure hinge 40;

Step 5 A second patterning of the polyimide layer 92 is performed into 92" using the same techniques as in Step 4. This defines the web 56 and the lower angled arm sections 60 of the flexure hinge 40;

Step 6 A first metal layer 94 (typically an alloy of Si and Al) is deposited and patterned using a combination of PVD and lift-off techniques. Alternatively a wet or dry metal etch can be used in place of using lift-off. The thickness of this layer 94 is typically less than 1 $\mu$m. This layer 94 defines the flexure hinge 40, and possibly the micromirror 42;

Step 7 A second metal or dielectric layer 96 (or a combination of both) is deposited and patterned using a combination of PVD, plasma enhanced chemical vapour deposition (PECVD) and lift-off techniques. Alternatively a wet or dry metal etch can be used in place of a lift-off. This layer(s) 96 define the micromirror 42. The thickness of these layers 96 are chosen based on various mechanical considerations such as mirror planarity during actuation; and Step 8 The sacrificial polyimide layer 92" is removed using isotropic plasma etching in an O₂ atmosphere. This liberates the micromirror device(s) M.

In the above process flow, there will be an opening 98 in the mirror 42 around the hinge 40, as seen in FIGS. 2a, 2b and 8(8).

In FIGS. 9(1) to 9(10), an alternate process flow for manufacturing a mirror incorporating the flexure hinge 40 is presented in which there is no opening 98 over the hinge area at the termination of the process and thus in which the mirror 42 is continuous over the flexure hinge 40. The process is the same as that of the process of FIGS. 8(1) to 8(8) except for the last six (6) steps which change in the second process of FIGS. 9(1) to 9(10). There is potential for extremely high fill factors using this second process. The first four steps which are shown in FIGS. 9(1) to 9(4) are described hereinabove in steps 1 to 5 of FIGS. 8(1) to 8(5). Steps 5 to 10 of this alternate process are shown in FIGS. 9(5) to 9(10) and are respectively as follows:

Step 5 A first metal layer 94 is deposited but not patterned. This layer 94 defines the flexure hinge 40, possibly the micromirror 42, and may also serve as an etch-stop layer for the etch back process described hereinbelow in step 7;

Step 6 Planarization of the structure is performed using one or more additional polyimide or other suitable layers 100;

Step 7 The planarisation layer 100 is etched back down as 100' to the first metal layer 94 to provide a planar surface 102 over the fabricated structure. The etch back is performed using a plasma etch in O₂ atmosphere;

Step 8 A second metal or dielectric layer 104 (or combination of both) is deposited using PVD or PECVD techniques. This layer(s) 104 define the micromirror 42;

Step 9 The micromirror geometrical form is defined at the level of layers 94 and 104 (which become 94' and 104', respectively) using a combination of standard lithography, and dry or wet etching; and Step 10 Both sacrificial polyimide layers 92" and 100' are removed using an isotropic plasma process in an O₂ atmosphere. This liberates the micromirror device M.

The process flow for the second flexure hinge 70 is now described. The process steps which are illustrated in FIGS. 10(1) to 10(10) are respectively as follows:

Step 1 The starting material is a passivated and planarized silicon wafer 106 equipped with a control circuit for the micromirror device or array of such devices. This circuit is fabricated using standard IC processing;

Step 2 The micromirror address electrodes 48 and 50 with a typical thickness not exceeding 0.5 μm are fabricated using a combination of PVD and lift-off techniques. Alternatively a wet or dry metal etch can be used in place of using lift-off;

Step 3 A first sacrificial polyimide layer 108 is deposited and patterned to define the lower section of the flexure hinge. The polyimide is patterned using a RIE process in an O₂ atmosphere, in combination with standard photolithography;

Step 4 A first metal layer 110 defining the flexure hinge 70 is deposited and patterned using a combination of the PVD technique and lift-off. Alternatively a wet or dry metal etch can be used in place of using lift-off;

Step 5 Planarisation of the structure is performed using a second polyimide layer 112. This layer may be partially etched back to adjust the height of the upper section of the flexure hinge 70;

Step 6 The second polyimide layer 112 is patterned into layer 112' using a combination of standard photolithography and RIE etching in a O₂ atmosphere;

Step 7 A second metal layer 114 is deposited and patterned to define the upper section of the flexure hinge 70. A combination of PVD and lift-off is used. Alternatively a wet or dry metal etch can be used in place of using lift-off;

Step 8 A second planarisation of the structure with a third polyimide layer 116 is performed. The third polyimide layer 116 is etched back to the upper surface of the flexure hinge 70. The etch back is performed using a plasma etching process in an O₂ atmosphere;

Step 9 The micromirror geometrical form is defined. The micromirror 42 is made of a metal or dielectric layer 118, or a combination of both. A combination of PVD and/or PECVD is used, combined with lift-off. Alternatively a wet or dry metal etch can be used in place of using lift-off; and Step 10 The three sacrificial polyimide layers 108, 112' and 116 are removed using isotropic plasma etching in an O₂ atmosphere. This liberates the micromirror device M'.

There are a number of advantages of this invention with respect to the prior art:

1. The flexure hinge (e.g. the flexure hinges 40 and 70) is particularly well suited for supporting large mirrors specifically in view of the fact that it is located under the mirror, and thus avoids the problem of sagging which can occur with conventional torsion or cantilever based hinges as these conventional hinges are intended and, in any event, rather restricted for use with small mirrors in view of their position respective thereto.

2. The flexure hinge has the unique property that the supported mirror (e.g. mirror 42) can be operated in phase or amplitude modulation mode, or in both.

3. The effective thermal conductance of the flexure hinge can be significantly higher than a comparable torsion hinge. The flexure hinge is wide and short, while the torsion hinge is narrow and long. Since the effective conductance is proportional to the ratio of the hinge width to the hinge length, the flexure hinge will provide better heat transfer to the underlying substrate. Adequate heat transfer is crucial for long term reliability of mirrors used in high power laser applications.

4. The flexure hinge design opens the possibility of fabricating mirror arrays with extremely high fill factors, comparable to those that can be obtained with the hidden hinge architecture developed by TI.

5. The hinge fabrication process is relatively simple. A two-layer superstructure is not required to obtain high fill factors.

6. The hinge design makes it inherently suitable for large mirrors.

It is contemplated to provide the light modulator with a single arm extending between the substrate and mirror thereof and capable of being actuated for tilting the mirror and/or moving it in a piston-like fashion.

The geometrical forms and parameters of the flexure hinge embodiments described herein may be further optimized so that the device performance can be improved. The fabrication process steps can also be further developed. While this invention has been described with reference to the illustrative embodiments, this description is not intended to be construed to a limiting sense. Various modifications or combinations of the illustrative embodiments, as well as other embodiments of the invention, will be apparent to persons skilled in the art upon reference to the description. It is therefore intended that the described invention encompasses any such modifications or embodiments.

We claim:

1. A hinge for supporting a mirror in a light modulator, comprising at least one arm means adapted to be provided at an upper end thereof with mirror means, said arm means being adapted to extend substantially under the mirror means and being displaceable between deformed and extended positions thereby allowing for the displacement of the mirror means.

2. A hinge as defined in claim 1, wherein said arm means comprise at least first and second sections defining an angle therebetween, said first section being adapted for connection to the mirror means, said first and second sections being adapted to pivot relative to one another thereby allowing said angle to vary and thus the mirror means to tilt and/or to vertically displace in a piston-like fashion.

3. A hinge as defined in claim 2, wherein said arm means comprise a pair of similar arms symmetrical about a plane extending perpendicularly to the mirror means when the mirror means is in an unbiased position thereof.

4. A hinge as defined in claim 3, wherein said first and second sections of each said arm are connected together by hinge means.

5. A hinge as defined in claim 4, wherein said hinge means is integrally formed with said first and second sections.

6. A hinge as defined in claim 3, wherein said arms are connected at lower ends thereof by web means extending substantially parallel to the mirror means when in its unbiased position, upper ends of said first sections of said arms being spaced apart from one another substantially centrally with respect to the mirror means.

7. A hinge as defined in claim 6, wherein said web means is integrally formed with said second sections of said arms.

8. A hinge as defined in claim 4, wherein said first sections each comprise an upper section, said second sections each comprising lower and intermediate sections, the lower sections diverging from one another as they extend upward, said upper sections also diverging from one another as they extend upward, said intermediate section extending between said upper and lower sections of each arm and substantially parallel to the mirror means when in its unbiased position, said upper sections being further spaced than said lower sections, said hinge means being provided at junctions of said intermediate sections with said upper and lower sections.

9. A hinge as defined in claim 4, wherein said arms are each V-shaped with apexes thereof extending outwardly of said plane, said hinge means being provided at said apexes.

10. A mirror for light modulators, comprising light receiving means, hinge means being adapted to be provided at an upper end thereof with said light receiving means, said hinge means being adapted to extend substantially under said light receiving means and being displaceable between deformed and extended positions thereby allowing for the displacement of said light receiving means.

11. A mirror as defined in claim 10, wherein said hinge means comprise at least first and second sections defining an angle therebetween, said first section being connected to said light receiving means, said first and second sections being adapted to pivot relative to one another thereby allowing said angle to vary and thus said light receiving means to tilt and/or to vertically displace in a piston-like fashion.

12. A mirror as defined in claim 11, wherein said hinge means comprise a pair of similar arms symmetrical about a plane extending perpendicularly to said light receiving means when said light receiving means is in an unbiased position thereof.

13. A mirror as defined in claim 12, wherein said arms are connected at lower ends thereof by web means extending substantially parallel to said light receiving means when in said unbiased position, said arms each having at least lower and upper sections, upper ends of said upper sections of said arms being spaced apart from one another substantially centrally with respect to said light receiving means.

14. A mirror as defined in claim 13, wherein said lower sections diverge from one another as they extend upward, said upper sections also diverging from one another as they extend upward, said arms each having an intermediate section extending between said upper and lower sections thereof and substantially parallel to said light receiving means when in said unbiased position, said under sections being further spaced than said lower sections, said intermediate sections being hingedly connected to said upper and lower sections.

15. A mirror as defined in claim 13, wherein said arms are each V-shaped with apexes thereof extending outwardly of said plane, said upper and lower sections being hingedly connected at said apexes.

16. A light modulator comprising mirror means, substrate means provided with electrode means, and hinge means extending between said substrate means and said mirror means and substantially under said mirror means, said hinge means being displaceable between deformed and extended positions for allowing for the displacement of said mirror means.

17. A light modulator as defined in claim 16, wherein said hinge means comprise at least first and second sections defining an angle therebetween, said first section being connected to said mirror means, said first and second sections being adapted to pivot relative to one another thereby allowing said angle to vary and thus said mirror means to tilt and/or to move in a piston-like fashion with respect to said substrate means.

18. A light modulator as defined in claim 17, wherein said hinge means comprise a pair of similar arm means symmetrical about a plane extending perpendicularly to said mirror means when said mirror is in an unbiased position thereof.

19. A light modulator as defined in claim 18, wherein said arm means are connected at lower ends thereof by web means extending onto said substrate means and substantially parallel to said mirror means when in said unbiased position, said arm means each having at least upper and lower sections, upper ends of said upper sections of said arm means being spaced apart from one another substantially centrally with respect to said mirror means.

20. A light modulator as defined in claim 19, wherein said lower sections diverge from one another as they extend upward, said upper sections also diverging from one another as they extend upward, said arm means each having an intermediate section extending between said upper and lower sections of each arm means and substantially parallel to said mirror means when in said unbiased position, said upper sections being further spaced than said lower sections, said intermediate sections being hingedly connected to said upper and lower sections.

21. A light modulator as defined in claim 19, wherein said arm means are each V-shaped with apexes thereof extending outwardly of said plane, said upper and lower sections being hingedly connected at said apexes.

22. A method for producing a light modulator, comprising the steps of:

(a) providing base means containing control circuit means for the light modulator and providing electrode means on said base means;

(b) providing a sacrificial layer means on said base means and electrode means;

(c) patterning said sacrificial layer means, at least part of a shape of which is complementary to a hinge of said light modulator and downwardly extends to said base means;

(d) providing first metal layer means on said sacrificial layer means and said base means for constituting said hinge;

(e) providing second metal layer means on said first metal layer means for constituting a mirror of said light modulator; and (f) removing said sacrificial layer means.

23. A method for producing a light modulator, comprising the steps of:

(a) providing base means containing control circuit means for the light modulator and providing electrode means on said base means;

(b) providing first sacrificial layer means on said base means and electrode means;

(c) patterning said first sacrificial layer means, at least part of a shape of which is complementary to a hinge of said light modulator and downwardly extends to said base means;

(d) providing first metal layer means on said first sacrificial layer means and said base means for constituting said hinge;

(e) providing second sacrificial layer means on part of said first metal layer means;

(g) providing second metal layer means on said first metal layer means and on said second sacrificial layer means for constituting a mirror of said light modulator; and (h) removing said first and second sacrificial layer means.

24. A method for producing a light modulator, comprising the steps of:

(a) providing base means containing control circuit means for the light modulator and providing electrode means on said base means;

(b) providing first sacrificial layer means on said base means and electrode means, said first sacrificial layer means having at least part of a shape thereof complementary to a lower part of a hinge of said light modulator and downwardly extending to said base means;

(c) providing first metal layer means on said first sacrificial layer means and said base means for constituting the lower part of said hinge;

(d) providing second sacrificial layer means on part of said first metal layer means;

(e) providing second metal layer means on said first metal layer means and on said second sacrificial layer means for constituting an upper part of said hinge;

(f) providing third sacrificial layer means on said second metal layer means and on said first sacrificial layer means;

(g) providing third metal layer means on said second metal layer means and on said third sacrificial layer means for constituting a mirror of said light modulator; and (h) removing said first, second and third sacrificial layer means.

* * * * *